US007525382B2

(12) United States Patent
An et al.

(10) Patent No.: US 7,525,382 B2

(45) Date of Patent: Apr. 28, 2009

(54) MULTI-LEVEL SLEW AND SWING CONTROL BUFFER

(75) Inventors: Hongming An, San Diego, CA (US); Sudhaker Anumula, San Diego, CA (US); Howard Chang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 65 days.

(21) Appl. No.: 11/888,921

(22) Filed: Aug. 4, 2007

(65) Prior Publication Data

US 2009/0033422 A1 Feb. 5, 2009

(51) Int. Cl.
*H03F 3/45* (2006.01)

(52) U.S. Cl. .................................... 330/261; 330/133

(58) Field of Classification Search ................. 330/261, 330/253, 310, 133; 375/233
See application file for complete search history.

(56) References Cited

U.S. PATENT DOCUMENTS 7,342,450 B2 * 3/2008 Jones ......................... 330/253
7,449,949 B2 * 11/2008 Sohn et al. .................. 330/253
2008/0247453 A1 * 10/2008 An et al. ..................... 375/233

* cited by examiner

*Primary Examiner*—Robert Pascal
*Assistant Examiner*—Hieu P Nguyen
(74) *Attorney, Agent, or Firm*—Law Office of Gerald Maliszewski; Gerald Maliszewski

(57) ABSTRACT

A buffer amplifier and an associated method have been provided for slew rate and swing level control in the buffering of a signal. The method accepts an input signal having a voltage swing, a swing control signal, and a slew rate control signal. The voltage swing for each output in a set of serially-connected buffer stages is selected in response to the swing control signal. The selected voltage swing for a subset of buffer stages is modified in response to the slew rate control signal. Selecting the voltage swing for each output entails selecting a source current for each buffer stage. A bias current is generated and mirrored through a current source connected to each buffer stage. Modifying the selected voltage swing for each of the subset of buffer stages includes modifying the bias current to the subset of buffer stages.

20 Claims, 6 Drawing Sheets

MULTI-LEVEL SLEW AND SWING CONTROL BUFFER

BACKGROUND OF THE INVENTION

1. Field of the Invention

This invention generally relates to electronic interface circuitry and, more particularly, to a system and method for simultaneously controlling both the slew rates and swing levels of an output data buffer amplifier in a data transmission system.

2. Description of the Related Art

A buffer made from series-connected amplifiers which may be used as an interface between circuits requiring different voltage swing (peak voltage) levels. More sophisticated buffer designs permit a user to adjust the output swing levels. However, because of the problem of maintaining interfaces within the buffer between amplifier stages, conventional designs only offer only one or two output swing level choices. The intra-buffer interface issue may result in an increase in signal jitter, as the eye quality of the output signal may vary over a wide range of output swing levels.

It would be advantageous if a buffer amplifier could provide a wide range of selectable output swing voltages.

In addition, it would be advantageous if the buffer amplifier included a means of selecting the slew rate associated with the output swing level.

SUMMARY OF THE INVENTION

The present disclosure describes a low power, low jitter, high speed buffer, able to operate at a baud rate of greater than 10 gigabits per second (Gbs), with swing and slew control for data transmission, such as in 10 gigabit Ethernet (GE) and SONET applications.

Accordingly, a method in provided for controlling multiple slew rates and swing levels in the output of a buffered signal. The method accepts an input signal having a voltage swing, a swing control signal, and a slew rate control signal. The voltage swing for each output in a set of serially-connected buffer stages is selected in response to the swing control signal. The selected voltage swing for a subset of buffer stages is modified in response to the slew rate control signal. An output signal is provided having a voltage swing and slew rate.

Selecting the voltage swing for each output entails selecting a source current for each buffer stage. A bias current is generated and mirrored through a current source connected to each buffer stage. Modifying the selected voltage swing for each of the subset of buffer stages includes modifying the bias current to the subset of buffer stages.

More explicitly, generating a bias current includes generating a plurality of bias currents for each of the subset of buffer stages that are mirroring current through a corresponding plurality of current sources parallel-connected to each of the subset of buffer stages. The bias current to the subset of buffer stages is modified by selectively supplying bias currents to the parallel-connected current sources.

Additional details of the above-described method and a buffer amplifier with slew rate and swing level control are provided below.

DETAILED DESCRIPTION

Figure 1:
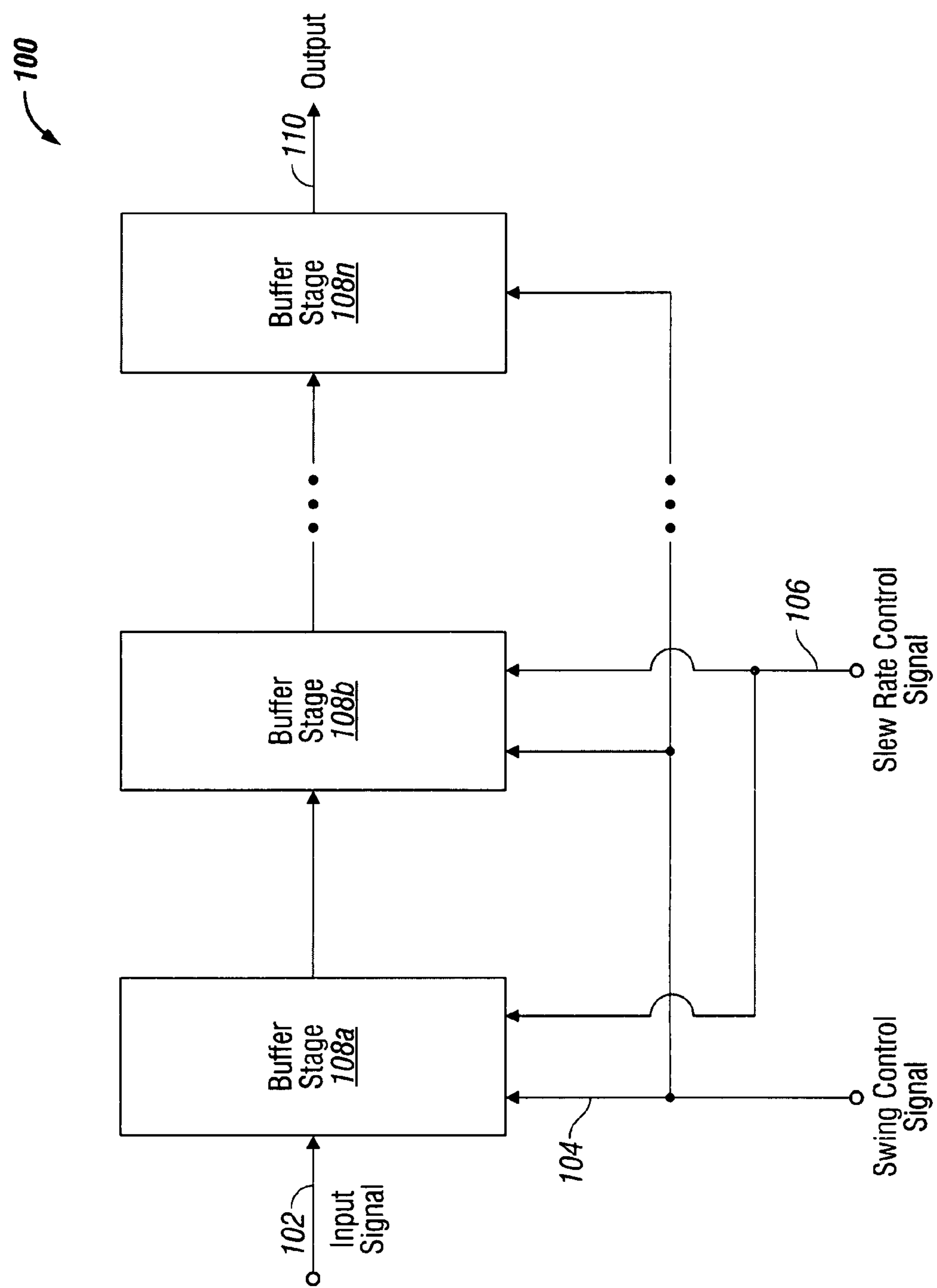
FIG. 1 is a schematic block diagram of a buffer amplifier with slew rate and swing level control.

FIG. 1 is a schematic block diagram of a buffer amplifier with slew rate and swing level control. The buffer amplifier 100 comprises an input on line 102 to accept an input signal having a voltage swing, an input on line 104 to accept a swing control signal, and an input on line 106 to accept a slew rate control signal. A plurality of series-connected buffer stages 108, each have a selectable voltage swing output responsive to the output swing control signal. Here, buffer stages 108*a*, 108*b*, through 108*n* are shown, where n is not limited to any particular value. The plurality of buffer stages 108*a*-108*n* includes a subset of buffer stages in which the selected voltage swing is modified in response to the slew rate control signal on line 109. In this example, the subset is composed of stages 108*a* and 108*b*. However, the buffer 100 is not limited to any particular number of stages in the subset. An output on line 110 supplies an output signal having a voltage swing and slew rate.

Figure 2:
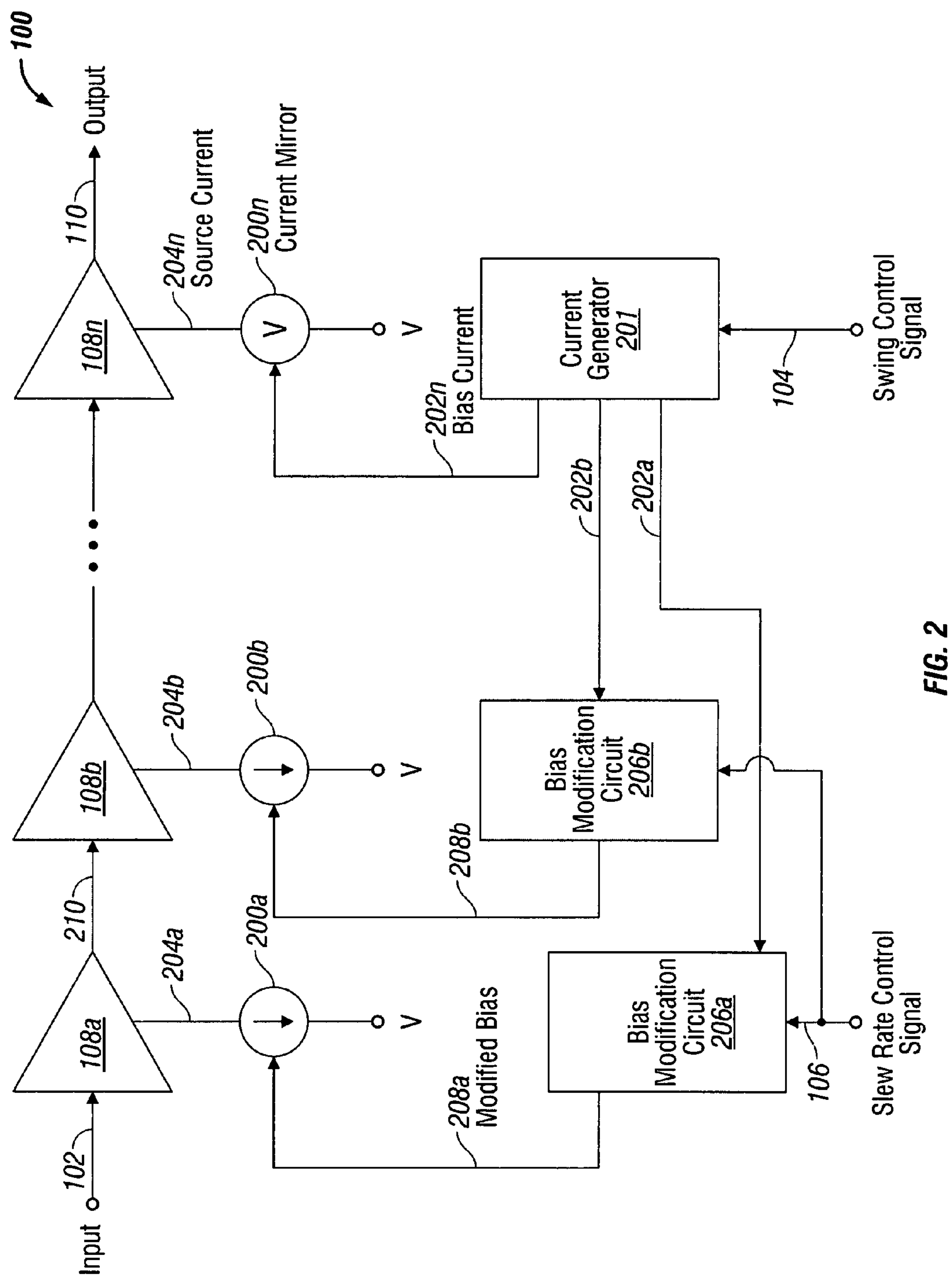
FIG. 2 is a schematic block diagram showing the buffer amplifier of FIG. 1 in greater detail.

FIG. 2 is a schematic block diagram showing the buffer amplifier of FIG. 1 in greater detail. Each buffer stage includes a current source to supply a source current to each buffer stage, responsive to the swing control signal on line 104. Shown are current sources 200*a*, 200*b*, and 200*n*, corresponding respectively with stages 108*a*, 108*b*, and 108*n*. A current generator 201 has an input on line 104 to accept the swing control signal and an output to supply a bias current 202 (202*a*, 202*b*, and 202*n*) to each current source 200 (200*a*, 200*b*, and 200*n*). Each current source 200 is a current mirror supplying a source current responsive to the bias current. The source currents from (to) the current sources 200*a*-200*n* are respectively supplied on lines 204*a*-204*n*.

There is a bias modification circuit 206 for each of the subset of buffer stages. Shown are bias modification circuits 206*a* and 206*b* associated with stages 108*a* and 108*b*, respectively. Bias modification circuit 206*a* and 206*b* have inputs on lines 202*a* and 202*b*, respectively, to accept bias current from the current generator 201, and an outputs on lines 208*a* and 208*b*, respectively, to supply a modified bias current responsive to the slew rate control signal on line 106.

Figure 3:
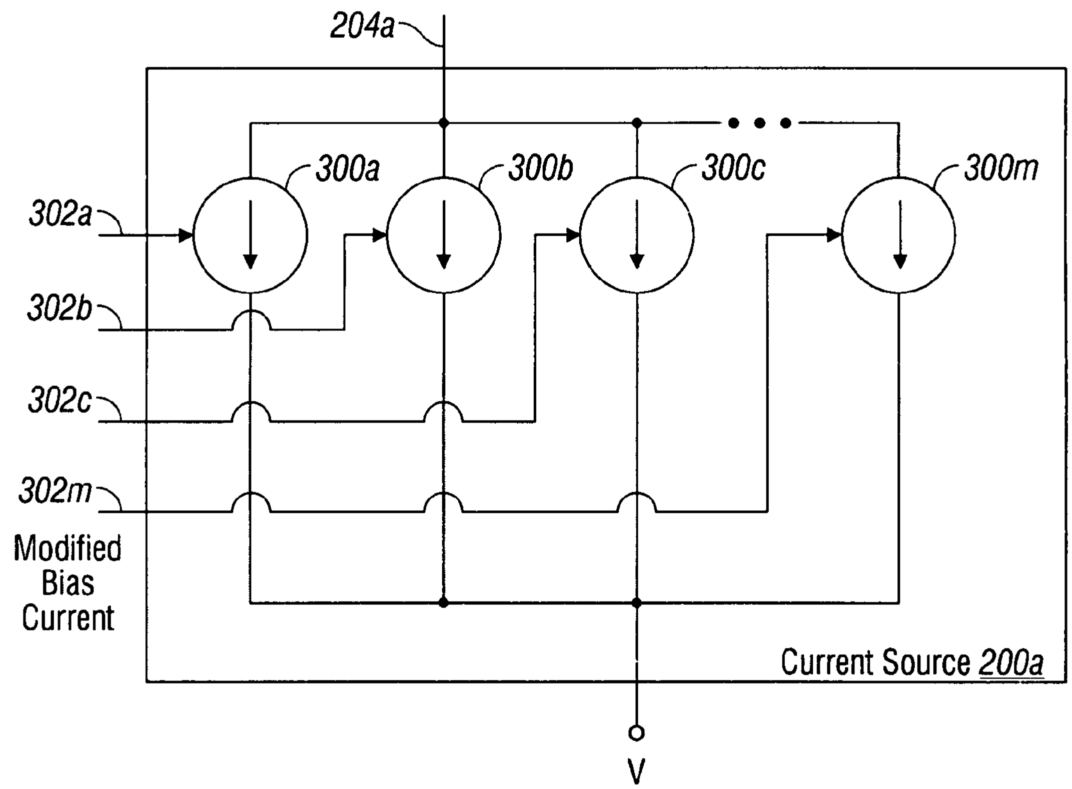
FIG. 3 is a schematic block diagram showing the buffer stage current mirror of FIG. 2 in greater detail.

FIG. 3 is a schematic block diagram showing the buffer stage current mirror 200*a* of FIG. 2 in greater detail. Although only current source 200*a* is shown in detail, the description of current source 200*a* also applies to other current sources (e.g., 200*b*) associated with the subset of buffer stages. Current mirror 200*a* includes a plurality of parallel-connected current mirrors. Shown are parallel mirrors 300*a* through 300*m*, where m is not limited to any particular value. The bias modification circuit 206*a* selectively supplies a modified bias current to each parallel-connected current mirror 300*a*-300*m* on lines 302*a* through 302*m*, respectively, in response to the slew rate control signal.

Considering both FIGS. 2 and 3, the first buffer stage 108*a* has an input to accept the input signal on line 102. The second buffer stage 108*b* having an input connected to the first buffer stage output on line 210. The current generator 201 supplies a first bias current to the first buffer stage 108*a* on line 202*a* and a second bias current to the second buffer stage 108*b* on line 202*b*, responsive to a first swing control signal on line 104. The first buffer stage bias modification circuit 206*a* increases the first bias current to the first buffer stage on line 208*a*, and the second buffer stage bias modification circuit 206*b* increases the second bias current to the second buffer stage on line 208*b*, in response to a fast slew rate control signal. Alternately stated, the "fast" slew rate control signal is a signal indicating that the slew rate is increased with respect to the previous slew rate setting.

In another aspect, the current generator 201 supplies a first bias current to the first buffer stage 108*a* on line 202*a* and a second bias current to the second buffer stage 108*b* on line 202*b*, responsive to a first swing control signal on line 104. The first buffer stage bias modification circuit 206*a* decreases the first bias current to the first buffer stage on line 208*a*, and the second buffer stage bias modification circuit 206*b* decreases the second bias current to the second buffer stage on line 208*b*, in response to a slow slew rate control signal. Alternately stated, the "slow" slew rate control signal is a signal indicating that the slew rate is decreased with respect to the previous slew rate setting. Additional details of slew rate adjustments to the voltage swing levels are provided below in the explanation of FIG. 8.

In another aspect, the buffer amplifier accepts a j-bit swing control word and a k-bit slew rate control word. Then, the current generator 201 selects between $2^j$ bias currents for each buffer stage in response to the swing control word. Each bias modification circuit 206*a* and 206*b* selects between $2^k$ bias current modifications in response to the slew rate control word. In one example, the buffer amplifier 100 accepts a 3-bit slew control word (k=3) and each of the subset of buffer stages includes 4 parallel-connected current mirrors (m=4). Each bias modification circuit 206 selectively supplies a modified bias current to each parallel-connected current mirror. Thus, there are 8 possible bias current (source current) options. In other aspects of the system, instead of being on/off, the modified bias current is variable. Four adjustable bias currents provide a greater number of source current options.

Figure 4:
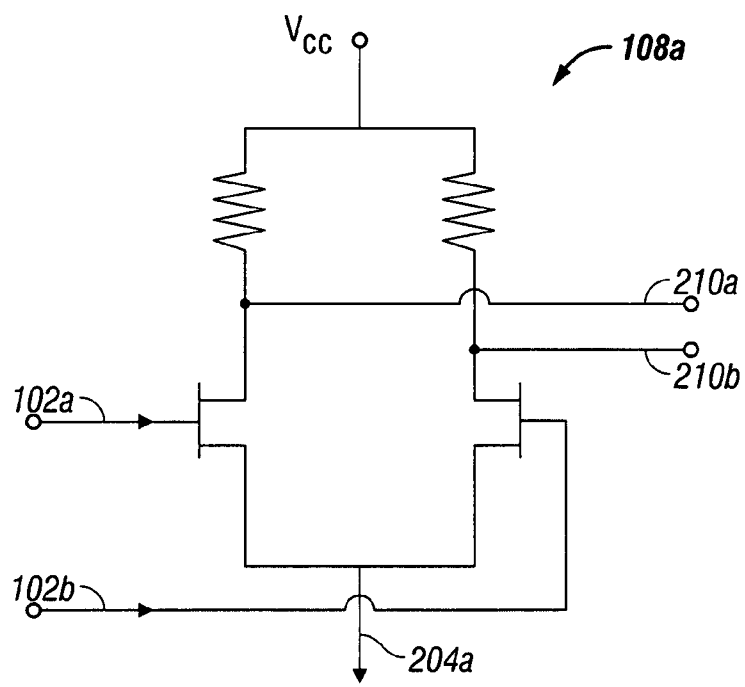
FIG. 4 is a detailed schematic diagram of the first buffer stage of FIG. 2.

FIG. 4 is a detailed schematic diagram of the first buffer stage of FIG. 2. Considering FIGS. 2 and 4, in one aspect the buffer amplifier 100 accepts a differential input signal on lines 102*a* and 102*b* having a first common mode level and supplies a differential output signal having a second common mode level. Each buffer stage 108*a*-108*n* is a differential amplifier, similar to the amplifier shown in FIG. 4. The series-connected buffer stages 108*a*-108*n* supply a common mode voltage that monotonically changes between buffer stages, from the first common mode level towards the second common mode level.

Figure 5:
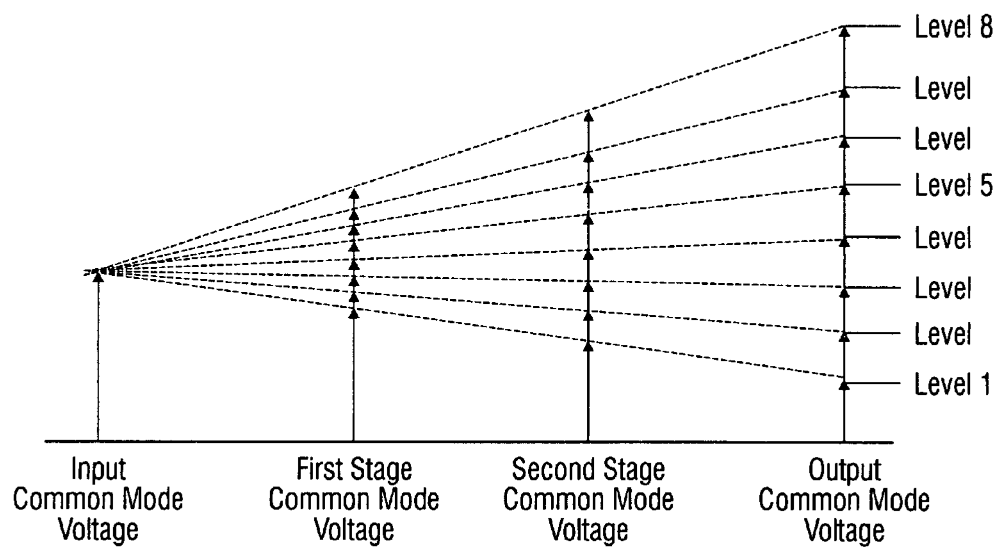
FIG. 5 is a diagram depicting the common mode voltage associated with 8 different swing level settings in a 3-stage buffer amplifier.

FIG. 5 is a diagram depicting the common mode voltage associated with 8 different swing level settings in a 3-stage buffer amplifier. As used herein, the common mode voltage Vc=½(V1+V2), where V1 and V2 are the two voltages associated with each differential input signal. The common mode voltage can also be described as an average voltage level. Using "level 8" as an example, the common mode voltage at the output is larger than at the input. The common mode voltages between stages monotonically changes from the input to the output. This same relationship can be seen with all 8 levels. As used herein, a monotonic change is a change that occurs uniformly—a change that continues in the same direction.

Figure 6:
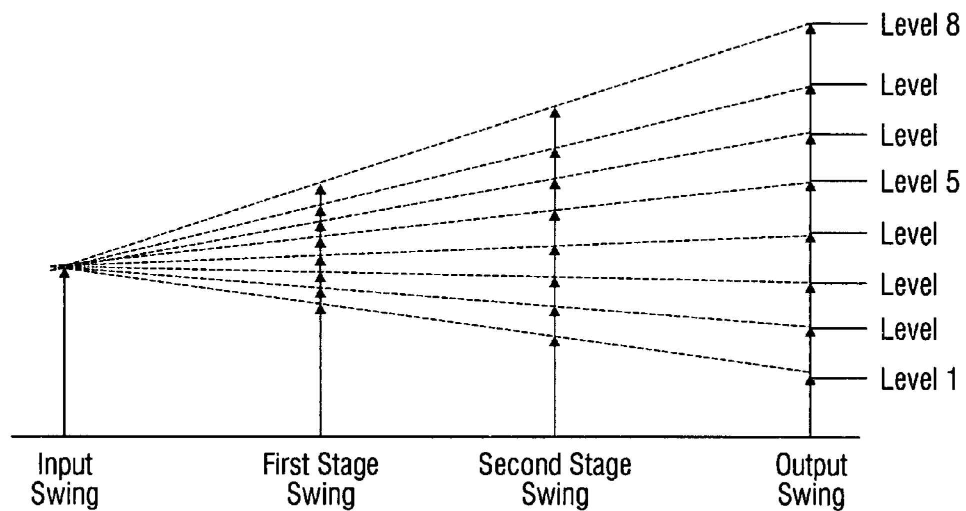
FIG. 6 is a diagram depicting the voltage swings associated with 8 different swing levels in a 3-stage buffer amplifier.

FIG. 6 is a diagram depicting the voltage swings associated with 8 different swing levels in a 3-stage buffer amplifier. In this aspect, the buffer amplifier accepts a differential input signal having a first voltage swing and supplies a differential output signal having a second voltage swing. Each series-connected buffer stage differential amplifier supplies a voltage swing that monotonically changes between buffer stages, from the first voltage swing towards the second voltage swing. Using "level 1" as an example, the voltage swing at the output is smaller than at the input. The voltage swing between stages monotonically changes from the input to the output. This same relationship can be seen with all 8 levels.

Functional Description

Figure 7:
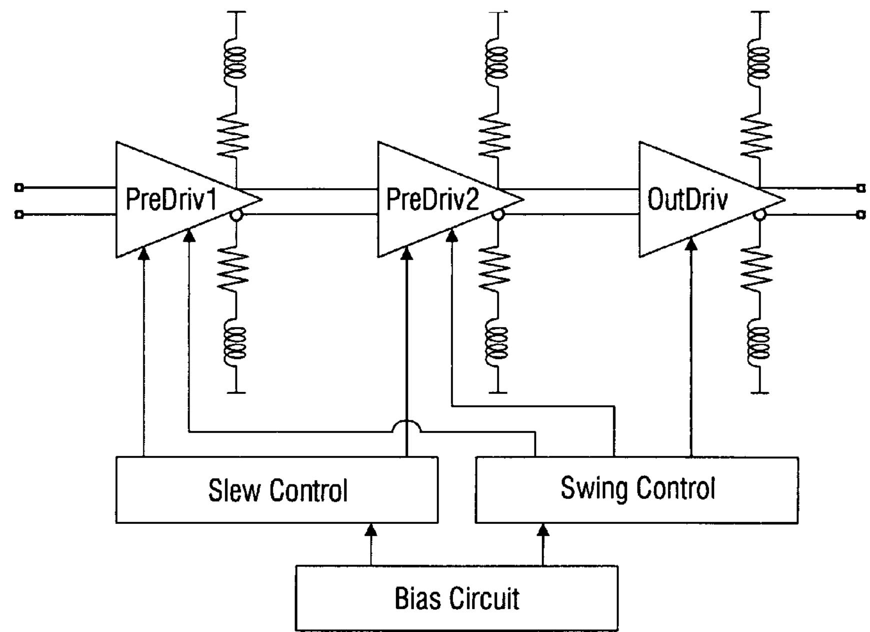
FIG. 7 is a schematic block diagram depicting a variation of the buffer amplifier of FIGS. 1 and 2.

FIG. 7 is a schematic block diagram depicting a variation of the buffer amplifier of FIGS. 1 and 2. In this example, the high speed data buffer consists of 3 common-mode logic (CML) buffer stages (PreDriv1, PreDriv2, and OutDriv). This circuit may receive a high speed signal from a data multiplexer, for example. To insure low jitter and a good quality eye for multiple output swing levels, the input signal is amplified and reshaped through 3 buffer stages to drive the adjacent circuitry and a 100 Ohm differential transmission line. The swing and slew control are achieved by changing the bias current and voltage of the three amplifier stages. Inductors may be used for all three stages to extend the bandwidth, thereby reducing power consumption.

Figure 8:
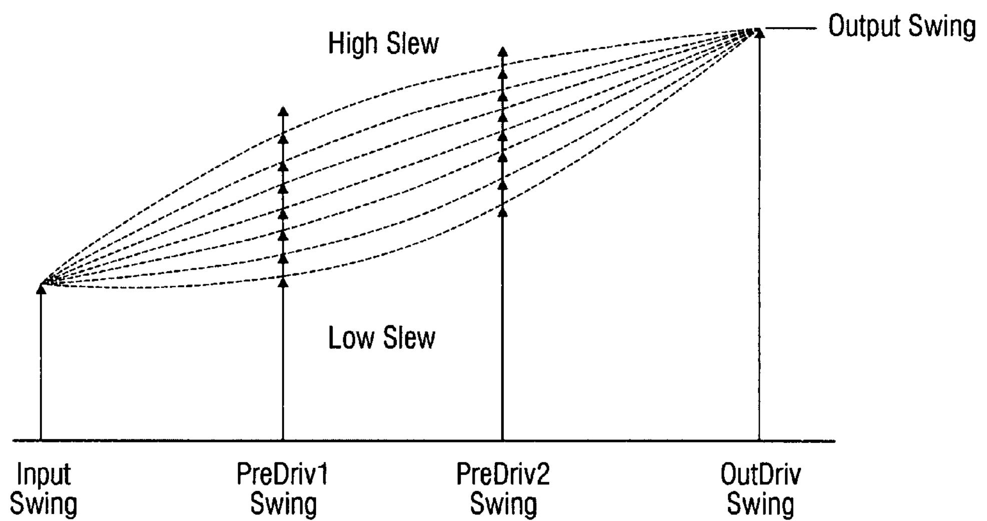
FIG. 8 is a diagram depicting slew rate modifications to the selected voltage swings associated with 8 different swing levels in a 3-stage buffer amplifier.

FIG. 8 is a diagram depicting slew rate modifications to the selected voltage swings associated with 8 different swing levels in a 3-stage buffer amplifier. As the input signal swing is fixed, the voltage swings of the following 3 stage are graduated to the final stage swing level setting though the control of the swings of PreDriv1, PreDriv2, and OutDriv. For a selected swing level, the signal slew rate or rise/fall time is changed by controlling the bias voltage and current of the first two stages (PreDriv1 and PreDriv2), such that the swing of these two stages are changed.

All the amplifiers operate on large signals, where each transistor is in the switch mode. Therefore, the amplifier output is limited. For this reason, output (driving) swing is a better measure of performance that the measurement of gain, which is associated with small signal operation.

Figure 9:
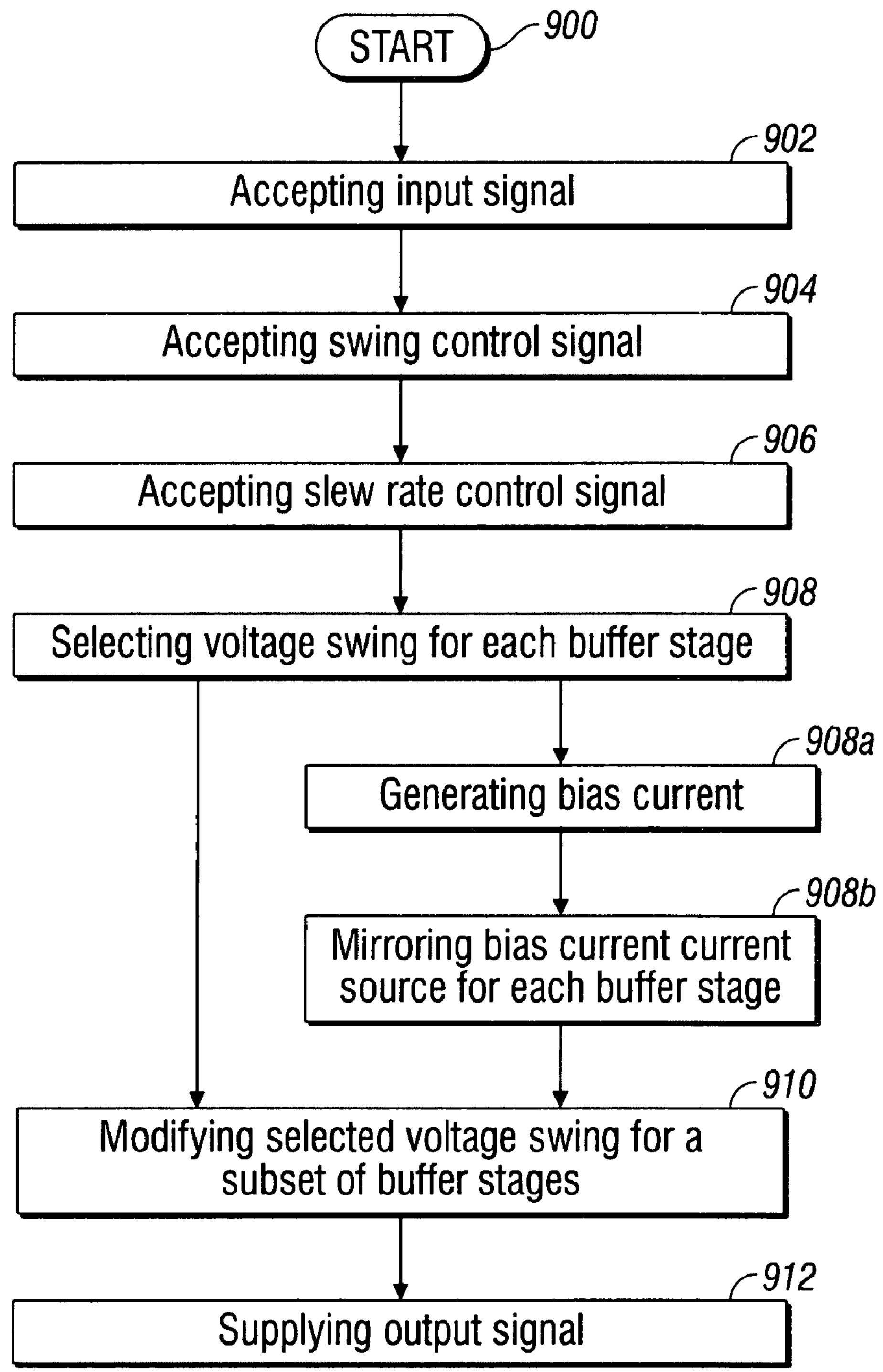
FIG. 9 is a flowchart illustrating a method for slew rate and swing level control in the buffering of a signal.

FIG. 9 is a flowchart illustrating a method for slew rate and swing level control in the buffering of a signal. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 accepts an input signal having a voltage swing. Step 904 accepts a swing control signal. Step 906 accepts a slew rate control signal. Step 908 selects the voltage swing for each output in a set of serially-connected buffer stages, in response to the swing control signal. Step 910 modifies the selected voltage swing for a subset of buffer stages in response to the slew rate control signal. Step 912 supplies an output signal having a voltage swing and slew rate.

In one aspect, selecting the voltage swing for each output in Step 908 includes selecting a source current for each buffer stage. In turn, selecting the source current for each buffer stage includes substeps. Step 908*a* generates a bias current. Step 908*b* mirrors the bias current through a current source connected to each buffer stage. Then, modifying the selected voltage swing for each of the subset of buffer stages in Step 910 includes modifying the bias current to the subset of buffer stages.

More explicitly, generating a bias current in Step 908*a* includes generating a plurality of bias currents for each of the subset of buffer stages, and mirroring the bias current through a current source connected to each buffer stage in Step 908*b* includes mirroring the plurality of bias currents through a corresponding plurality of current sources parallel-connected to each of the subset of buffer stages. Then, modifying the bias current to the subset of buffer stages in Step 910 includes selectively supplying bias currents to the parallel-connected current sources.

In one aspect, accepting the input signal in Step 902 includes accepting the input signal at a first buffer stage, series-connected to a second buffer stage, both from the subset of buffer stages. In this aspect, Step 904 accepts a first swing control signal, and Step 906 accepts a fast slew rate control signal. Step 908 selects a first voltage swing for the first stage and a second voltage swing for the second stage, in response to the first swing control signal. Step 910 increases the first voltage swing of the first buffer stage and increases the second voltage swing of a second stage, in response to the fast slew rate control signal.

In another aspect, Step 904 accepts the first swing control signal, and Step 906 accepts a slow slew rate control signal. Step 908 selects a first voltage swing for the first stage and a second voltage swing for the second stage, in response to the first swing control signal. Step 910 decreases the first voltage swing and decreases the second voltage swing of a second stage, in response to the slow slew rate control signal.

In one aspect, accepting the swing control signal in Step 904 includes accepting an n-bit control word, and accepting the slew rate control signal in Step 906 includes accepting an m-bit control word. Selecting the voltage swing for each buffer stage in Step 908 includes selecting between $2^n$ output swing levels. Modifying the selected voltage swing for the subset of the buffer stages in Step 910 includes selecting between $2^m$ modifications. For example, if Step 906 accepts a 3-bit slew rate signal control word, then generating the plurality of bias currents for each of the subset of buffer stages in step 908*a* includes selectively supplying 4 bias currents for each of the subset of buffer stages.

In another aspect, Step 902 accepts a differential input signal having a first common mode level, and Step 912 supplies a differential output signal having a second common mode level. Then, selecting the voltage swing for each output in the set of serially-connected buffer stages in Step 908 includes selecting common mode voltages that monotonically change between buffer stages, from the first common mode voltage towards the second common mode voltage.

In another aspect, Step 902 accepts a differential input signal having a first voltage swing, and Step 912 supplies a differential output signal having a second voltage swing. Then, Step 908 selects voltage swings that monotonically change between buffer stages, from the first voltage swing towards the second voltage swing.

A buffer amplifier with selectable voltage swing levels and slew rates has been provided. Particular arrangements of amplifiers and current sources have been provided as examples, to illustrate the invention. However, the invention is not limited to merely these examples. Other variations and embodiments of the invention will occur to those skilled in the art.

We claim:

1. A method for slew rate and swing level control in the buffering of a signal, the method comprising:

accepting an input signal having a voltage swing;

accepting a swing control signal;

accepting a slew rate control signal;

selecting the voltage swing for each output in a set of serially-connected buffer stages, in response to the swing control signal;

modifying the selected voltage swing for a subset of buffer stages in response to the slew rate control signal; and supplying an output signal having a voltage swing and slew rate.

2. The method of claim 1 wherein selecting the voltage swing for each output includes selecting a source current for each buffer stage.

3. The method of claim 2 wherein selecting the source current for each buffer stage includes:

generating a bias current;

mirroring the bias current through a current source connected to each buffer stage; and, wherein modifying the selected voltage swing for each of the subset of buffer stages includes modifying the bias current to the subset of buffer stages.

4. The method of claim 3 wherein generating a bias current includes generating a plurality of bias currents for each of the subset of buffer stages;

wherein mirroring the bias current through a current source connected to each buffer stage includes mirroring the plurality of bias currents through a corresponding plurality of current sources parallel-connected to each of the subset of buffer stages; and, wherein modifying the bias current to the subset of buffer stages includes selectively supplying bias currents to the parallel-connected current sources.

5. The method of claim 1 wherein accepting the input signal includes accepting the input signal at a first buffer stage, series-connected to a second buffer stage, both from the subset of buffer stages;

wherein accepting the swing control signal includes accepting a first swing control signal;

wherein accepting a slew rate control signal includes accepting a fast slew rate control signal;

wherein selecting the voltage swing for each output in a set of serially-connected buffer stages includes selecting a first voltage swing for the first buffer stage and a second voltage swing for the second buffer stage, in response to the first swing control signal; and, wherein modifying the selected voltage swing for each of the subset of buffer stages includes increasing the first voltage swing and increasing the second voltage swing, in response to the fast slew rate control signal.

6. The method of claim 1 wherein accepting the input signal includes accepting the input signal at a first buffer stage, series-connected to a second buffer stage, both from the subset of buffer stages;

wherein accepting the swing control signal includes accepting a first swing control signal;

wherein accepting a slew rate control signal includes accepting a slow slew rate control signal;

wherein selecting the voltage swing for each output in a set of serially-connected buffer stages includes selecting a first voltage swing for the first buffer stage and a second voltage swing for the second buffer stage, in response to the first swing control signal; and, wherein modifying the selected voltage swing for each of the subset of buffer stages includes decreasing the first voltage swing and decreasing the second voltage swing in response to the slow slew rate control signal.

7. The method of claim 4 wherein accepting the swing control signal includes accepting an n-bit control word;

wherein accepting the slew rate control signal includes accepting an m-bit control word;

wherein selecting the voltage swing for each buffer stage includes selecting between $2^n$ output swing levels; and, wherein modifying the selected voltage swing for the subset of the buffer stages includes selecting between $2^m$ modifications.

8. The method of claim 7 wherein accepting the slew rate control signal includes accepting a 3-bit control word; and, wherein generating the plurality of bias currents for each of the subset of buffer stages includes selectively supplying 4 bias currents for each of the subset of buffer stages.

9. The method of claim 1 wherein accepting the input signal includes accepting a differential input signal having a first common mode level;

wherein supplying the output signal includes supplying a differential output signal having a second common mode level; and, wherein selecting the voltage swing for each output in the set of serially-connected buffer stages includes selecting common mode voltages that monotonically change between buffer stages, from the first common mode voltage towards the second common mode voltage.

10. The method of claim 1 wherein accepting the input signal includes accepting a differential input signal having a first voltage swing; and, wherein supplying an output signal includes supplying a differential output signal having a second voltage swing; and, wherein selecting the voltage swing for each output in the set of serially-connected buffer stages includes selecting voltage swings that monotonically change between buffer stages, from the first voltage swing towards the second voltage swing.

11. A buffer amplifier with slew rate and swing level control, the buffer amplifier comprising:

an input to accept an input signal having an voltage swing;

an input to accept a swing control signal;

an input to accept a slew rate control signal;

a plurality of series-connected buffer stages, each having a selectable voltage swing output responsive to the output swing control signal;

wherein the plurality of buffer stages includes a subset of buffer stages in which the selected voltage swing is modified in response to the slew rate control signal; and an output supplying an output signal having a voltage swing and slew rate.

12. The buffer amplifier of claim 11 further comprising:

a current source to supply a source current to each buffer stage, responsive to the swing control signal.

13. The buffer amplifier of claim 12 further comprising:

a current generator having an input to accept the swing control signal and an output to supply a bias current to each current source;

wherein each current source is a current mirror supplying a source current responsive to the bias current; and, the buffer amplifier further comprising:

a bias modification circuit for each of the subset of buffer stages, each bias modification circuit having an input to accept bias current from the current generator and an output to supply a modified bias current responsive to the slew rate control signal.

14. The buffer amplifier of claim 13 wherein each of the subset of buffer stage current mirrors includes a plurality of parallel-connected current mirrors; and, wherein each bias modification circuit selectively supplies a modified bias current to each parallel-connected current mirror, in response to the slew rate control signal.

15. The buffer amplifier of claim 14 wherein the subset of buffer stages includes a first buffer stage having an input to accept the input signal, and a second buffer stage having an input connected to the first buffer stage output;

wherein the current generator supplies a first bias current to the first buffer stage and a second bias current to the second buffer stage, responsive to a first swing control signal; and, wherein a first buffer stage bias modification circuit increases the first bias current to the first buffer stage, and a second buffer stage biasmodification circuit increases the second bias current to the second buffer stage, in response to a fast slew rate control signal.

16. The buffer amplifier of claim 14 wherein the subset of buffer stages includes a first buffer stage having an input to accept the input signal, and a second buffer stage having an input connected to the first buffer stage output;

wherein the current generator supplies a first bias current to the first buffer stage and a second bias current to the second buffer stage, responsive to a first swing control signal; and, wherein a first buffer stage bias modification circuit decreases the first bias current to the first buffer stage, and a second buffer stage bias modification circuit decreases the second bias current to the second buffer stage, in response to a slow slew rate control signal.

17. The buffer amplifier of claim 14 wherein the buffer amplifier accepts an n-bit swing control word and an n-bit slew rate control word;

wherein the current generator selects between $2^n$ bias currents for each buffer stage in response to the swing control word; and, wherein each bias modification circuit selects between $2^m$bias current modifications in response to the slew rate control word.

18. The buffer amplifier of claim 17 wherein the buffer amplifier accepts a 3-bit slew control word;

wherein each of the subset of buffer stages includes 4parallel-connected current mirrors; and, wherein each bias modification circuit selectively supplies a modified bias current to each parallel-connected current mirror.

19. The buffer amplifier of claim 11 wherein the buffer amplifier accepts a differential input signal having a first common mode level and supplies a differential output signal having a second common mode level; and, wherein each buffer stages is a differential amplifier, where the series-connected buffer stages supply a common mode voltage that monotonically changes between buffer stages, from the first common mode level towards the second common mode level.

20. The buffer amplifier of claim 11 wherein the buffer amplifier accepts a differential input signal having a first voltage swing and supplies a differential output signal having a second voltage swing; and, wherein each buffer stages is a differential amplifier, where the series-connected buffer stages supply a voltage swing that monotonically changes between buffer stages, from the first voltage swing towards the second voltage swing.

* * * * *

UNITED STATES PATENT AND TRADEMARK OFFICE

CERTIFICATE OF CORRECTION

PATENT NO. : 7,525,382 B2
APPLICATION NO. : 11/888921
DATED : April 28, 2009
INVENTOR(S) : Hongming An et al.

It is certified that error appears in the above-identified patent and that said Letters Patent is hereby corrected as shown below:

In col. 8, line 17, there is an error in claim 15. The term "biasmodification" is printed. The phrase should be "bias modification".

In col. 8, lines 33-34, there is an error in claim 17. The phrase "n-bit slew rate control word" is printed. The phrase should be "m-bit slew rate control word".

In col. 8, lines 43-44, there is an error in claim 18. The phrase "4parallel-connected" is written. The phrase should be "4 parallel-connected".

Signed and Sealed this

Second Day of June, 2009

JOHN DOLL
*Acting Director of the United States Patent and Trademark Office*